United States Patent
Jun et al.

(10) Patent No.: US 7,119,638 B2
(45) Date of Patent: Oct. 10, 2006

(54) FILM BULK ACOUSTIC RESONATOR HAVING AN AIR GAP AND A METHOD FOR MANUFACTURING THE SAME

(75) Inventors: Chan-bong Jun, Seoul (KR); O-gweon Seo, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 84 days.

(21) Appl. No.: 10/827,348

(22) Filed: Apr. 20, 2004

(65) Prior Publication Data

US 2004/0207490 A1    Oct. 21, 2004

(30) Foreign Application Priority Data

Apr. 21, 2003    (KR) ............... 10-2003-0025231

(51) Int. Cl.
*H03H 9/15* (2006.01)
*H03H 3/02* (2006.01)

(52) U.S. Cl. ............ 333/187; 310/324; 29/25.35
(58) Field of Classification Search ............ 333/187; 310/324; 29/25.35
See application file for complete search history.

(56) References Cited

U.S. PATENT DOCUMENTS

| | | | |
|---|---|---|---|
| 4,890,370 A | 1/1990 | Fukuda et al. ............ 29/25.35 |
| 6,355,498 B1 * | 3/2002 | Chan et al. ............ 438/48 |
| 6,486,751 B1 * | 11/2002 | Barber et al. ............ 333/187 |
| 6,657,363 B1 * | 12/2003 | Aigner ............ 310/324 |
| 6,732,415 B1 * | 5/2004 | Nakatani et al. ............ 29/25.35 |
| 6,842,089 B1 * | 1/2005 | Lee ............ 333/189 |
| 2001/0002663 A1 | 6/2001 | Tai et al. ............ 216/79 |
| 2002/0067106 A1 | 6/2002 | Sunwoo et al. ............ 310/330 |
| 2002/0190814 A1 | 12/2002 | Yamada et al. ............ 333/187 |
| 2003/0193269 A1 | 10/2003 | Jang et al. ............ 310/346 |

FOREIGN PATENT DOCUMENTS

| EP | 1 180 494 A2 | 2/2002 |
|---|---|---|
| EP | 1 180 494 A3 | 2/2002 |

OTHER PUBLICATIONS

Kovacs, et al., "Bulk Micromachining of Silicon", Proceedings of the IEEE, 86(8):1536-1551 (Aug. 1998).

* cited by examiner

*Primary Examiner*—Barbara Summons
(74) *Attorney, Agent, or Firm*—Lee & Morse P.C.

(57) ABSTRACT

A film bulk acoustic resonator (FBAR) includes a resistance layer deposited on the upper surface of a semiconductor substrate and having a recess therein, a membrane layer on the upper surfaces of the resistance layer and the recess, thereby forming an air gap between the membrane layer and the semiconductor substrate, and a resonator having a lower electrode, a piezoelectric layer, and an upper electrode deposited on the membrane layer. The resistance layer may include first and second resistance layers, the first resistance layer having the recess therein and the second resistance layer being deposited on the upper surfaces of the recess. Thus, the air gap is formed without etching the semiconductor substrate, enhancing the resonant characteristics of the FBAR. Active and/or passive devices can be formed underneath the air gap to be integrated with the FBAR.

18 Claims, 5 Drawing Sheets

FILM BULK ACOUSTIC RESONATOR HAVING AN AIR GAP AND A METHOD FOR MANUFACTURING THE SAME

BACKGROUND OF THE INVENTION

1. Field of the Invention

The present invention relates to an acoustic resonator and a method for manufacturing the same. More particularly, the present invention relates to a film bulk acoustic resonator (FBAR) using a piezoelectric material and a method for manufacturing the same.

2. Description of the Related Art

Recently there have been dramatic developments in wireless mobile communication technologies. Such mobile communication technologies require diverse radio frequency (RF) parts that can efficiently transfer information in a limited frequency bandwidth. In particular, the filter of the RF parts is one of the key elements in mobile communication technologies. This filter serves to filter innumerable waves in air to allow users to select or transfer desired signals, thereby enabling high-quality communications.

Currently, wireless communication RF filters are typically dielectric filters or surface acoustic wave (SAW) filters. A dielectric filter provides high dielectric permittivity, low insertion loss, stability at high temperatures, and is robust to vibration and shock. However, the dielectric filter cannot be sufficiently reduced in size and cannot be integrated with other integrated circuits (ICs), including the recently developed Monolithic Microwave Integration Circuit (MMIC). In contrast, a SAW filter provides a small size, facilitates processing signals, has a simplified circuit, and can be mass-produced using semiconductor processes. Further, the SAW filter provides a high side rejection in a passband compared to the dielectric filter, allowing it to transmit and receive high-quality information. However, using conventional InterDigital Transducers (IDTs) for a SAW filter limits its line width, since the process for creating such a SAW filter includes exposure to ultraviolet (UV) light. Currently, such a SAW filter's line width is limited to about 0.5 µm. Accordingly, the SAW filter cannot cover the high frequency bands, e.g., over 5 GHz. Further, it is still difficult to integrate a SAW filter with the MMIC structure on a semiconductor substrate as a single chip.

In order to overcome the limits and problems as above, a film bulk acoustic resonance (FBAR) filter has been proposed in which a frequency control circuit can be completely constructed in the form of MMIC with other active devices integrated together on an existing Si or GaAs semiconductor substrate.

The FBAR is a thin film device that is low-priced, small-sized, and can be designed to have a high-Q. Thus, the FBAR filter can be used in wireless communication equipment of various frequency bands, for example, ranging from 900 MHz to 10 GHz and military radar. The FBAR can be made an order of magnitude smaller than a dielectric filter or a lumped constant (LC) filter and has a very low insertion loss compared to the SAW filter. The FBAR can be integrated with the MMIC while providing a filter having a high stability and a high-Q factor.

The FBAR filter includes a piezoelectric dielectric material such as ZnO, AlN, or any appropriate material having a high acoustic velocity. The piezoelectric material may be directly deposited onto a Si or GaAs semiconductor substrate, e.g., by RF sputtering. The resonance of the FBAR filter arises from the piezoelectric characteristics of the piezoelectric material used therein. More particularly, the FBAR filter includes a piezoelectric film disposed between two electrodes, and generates bulk acoustic waves to induce resonance.

FIG. 1 illustrates a cross-section of a conventional membrane-based (or bulk micro-machining-based) FBAR. This membrane-based FBAR includes a silicon oxide layer ($SiO_2$) deposited on a substrate 11 forming a membrane layer 12 on the reverse side of the substrate 11 through a cavity 16 formed by isotropic etching. A resonator 17 includes a lower electrode layer 13 formed on the membrane layer 12, a piezoelectric layer 14 on the lower electrode layer 13, and an upper electrode layer 15 on the piezoelectric layer 14.

The above membrane-based FBAR provides a low dielectric loss of the substrate 11 and less power loss due to the cavity 16. However, the membrane-based FBAR occupies a large area due to the orientation of the silicon substrate, and is easily damaged due to the low structural stability upon a subsequent packaging process, resulting in low yield. Accordingly, recently, air gap-type and Bragg reflector-based FBARs have been created to reduce the loss due to the membrane and simplify the device manufacturing process.

FIG. 2 illustrates a cross-section of a structure of a conventional air gap-type FBAR. The FBAR has a membrane layer 42 formed on a semiconductor substrate 41 and a resonator 46. The resonator 46 includes a lower electrode 43, a piezoelectric layer 44, and an upper electrode 45 deposited in that order on the membrane layer 42. The membrane layer 42 has the predetermined number of through holes 42' used to inject etching solution therethrough. This etching solution injection forms recesses on partial portions of the substrate 41 to form air gaps 41' between the substrate 41 and the membrane layer 42.

However, the substrate etching process for the conventional air gap-type FBAR results in many defects. Wet etching is used for the substrate etching process in general. It is difficult to remove the etching solution after the wet etching process. This residual etching solution results in minute etching. Such etching changes the resonant frequency of the resonator.

Further, when etching the substrate, the etching solution also etches part of electrodes and piezoelectric material. This unintended etching is likely to further change the resonant frequency of the resonator.

In order to insure reasonable reliability of the FBAR produced this way, an extra tuning process to set up a desired frequency is required. Further, in order to reduce the dielectric loss of the substrate, the conventional FBAR having an air gap formed through substrate etching has to use a high-resistance substrate or a very thick membrane layer, both of which are undesirable.

SUMMARY

The present invention is therefore directed to a film bulk acoustic resonator (FBAR) and a manufacturing method thereof, which substantially overcome one or more of the problems due to the limitations and disadvantages of the related art.

It is a feature of the present invention to provide a thin FBAR and a method for manufacturing the same, capable of reducing a dielectric loss of a substrate without using a high resistance substrate. It is another feature of the present invention to provide a thin FBAR and a method for manufacturing the same that includes forming an air gap without etching the substrate. It is yet another feature of the present invention to provide a thin FBAR and a method for manufacturing the same that provides reliable and enhanced resonance characteristics.

At least one of the above and other features can be realized by providing a FBAR including a semiconductor substrate, a resistance layer on the semiconductor substrate, the resistance layer having a recess, a membrane layer on an upper portion of the resistance layer and over the recess, thereby forming an air gap between the membrane layer and the semiconductor substrate at the recess, a first electrode on an upper portion of the membrane layer, a piezoelectric layer on the upper portion of the membrane layer and on an upper portion of the first electrode, and a second electrode on an upper portion of the piezoelectric layer.

The semiconductor substrate may be controlled to have a predetermined thickness. The FBAR may include a second resistance layer having a predetermined thickness in the recess. The second resistance layer may be on the upper portion of the resistance layer, between the resistance layer and the membrane layer. The resistance layer may have a predetermined thickness in the recess.

At least one of the above and other features can be realized by providing a method for manufacturing a FBAR including forming a resistance layer on an upper surface of a semiconductor substrate, the resistance layer including a recess, filling the recess with a sacrificial material, providing a membrane layer on an upper surface of the resistance layer and an upper surface of the sacrificial material, forming a first electrode on an upper surface of the membrane layer, forming a piezoelectric layer on the upper surface of the membrane layer and on an upper surface of the first electrode, forming a second electrode on an upper surface of the piezoelectric layer, and removing the sacrificial material, thereby forming an air gap between the semiconductor substrate and the membrane layer.

The forming of the resistance layer may include depositing a resistance material on the upper surface of the semiconductor substrate, patterning an air gap forming position on an upper surface of the resistance layer, removing a portion of the resistance material in the air gap patterning position from the upper surface of the resistance layer to form the recess. The pattering of the air gap forming position may include providing a patterning material on an upper surface of the resistance material. The patterning material may be removed after the removing of the portion of the resistance material. The removing of the portion of the resistance material may include etching the resistance material. The removing of the portion of the resistance material may include removing all of the resistance material in the air gap portion or may include leaving the resistance material at a predetermined thickness in the air gap portion.

The method may further include forming a second resistance layer on an upper surface of the recess. The forming of the second resistance layer may include depositing a second resistance material on upper surfaces of the recess and the resistance layer. The method may further include flattening the upper surface of the resistance layer after filling the recess with the sacrificial material. The sacrificial material may be polysilicon. The removing of the sacrificial material may include dry-etching the sacrificial material. The dry-etching may include using fluorochemical gas in a non-plasma state. The method may include etching the semiconductor substrate to a predetermined thickness before the forming of the resistance layer. The forming of the resistance layer may include exposing the semiconductor substrate through the recess.

As noted above, the FBAR and the manufacturing method therefor according to the present invention can improve the resonance characteristics since an air gap can be formed without etching the substrate, reduce the substrate damage without using a high-resistance substrate, and improve integration, since active and/or passive devices can be integrated on the lower portions of the air gaps.

BRIEF DESCRIPTION OF THE DRAWINGS

The above aspect and other features of the present invention will become more apparent by describing in detail illustrative, non-limiting embodiments thereof with reference to the attached drawings, and wherein.

DETAILED DESCRIPTION

Figure 1:
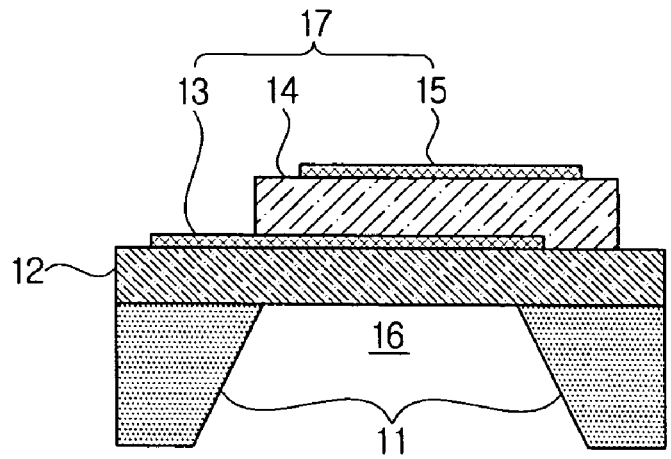
FIG. 1 illustrates a cross-section of a conventional membrane-type FBAR.
Figure 2:
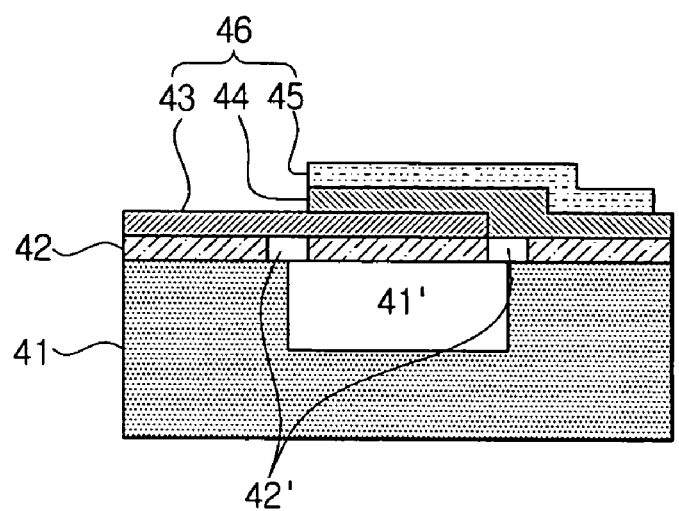
FIG. 2 illustrates a cross-section of a conventional air gap-type FBAR.

Korean Patent Application No. 2003-25231, filed on Apr. 21, 2003, in the Korean Intellectual Property Office, and entitled "FILM BULK ACOUSTIC RESONATOR HAVING AIR GAP FLOATING FROM SUBSTRATE AND A METHOD FOR MANUFACTURING THE SAME," is incorporated herein by reference in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

Figure 3A:
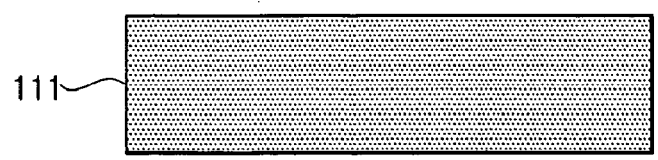
FIG. 3A to FIG. 3K illustrate cross-sections showing, in order, processes for manufacturing a FBAR according to an embodiment of the present invention, with FIG. 3K illustrating a cress-section of the manufactured FBAR according to an embodiment of the present invention.
Figure 3B:
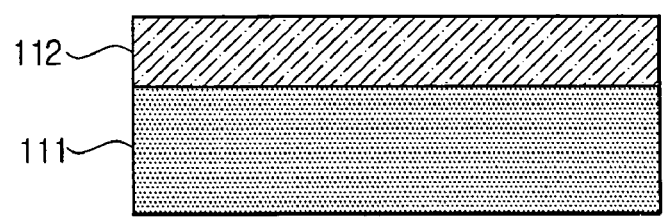
Figure 3C:
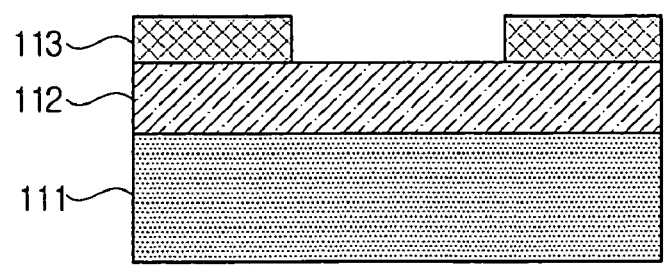
Figure 3D:
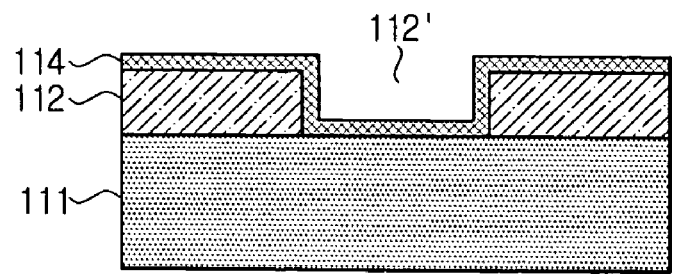
Figure 3E:
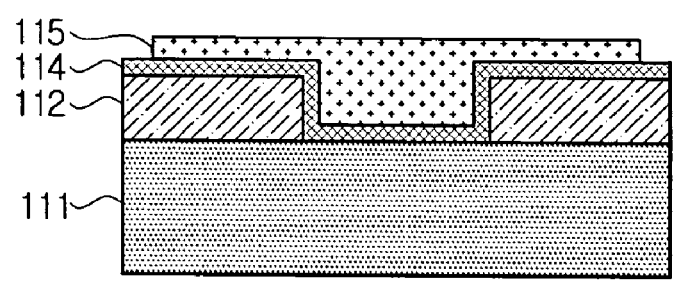
Figure 3F:
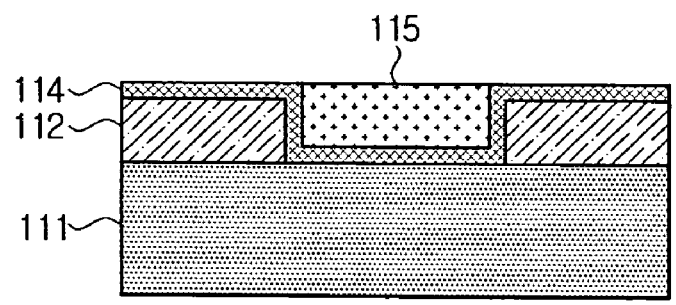
Figure 3G:
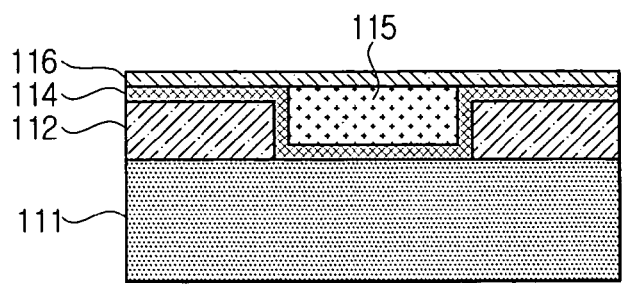
Figure 3H:
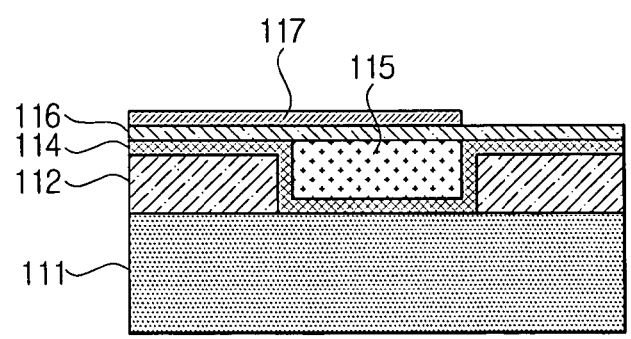
Figure 3I:
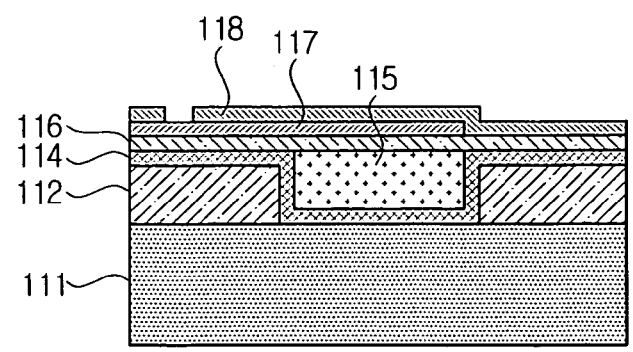
Figure 3J:
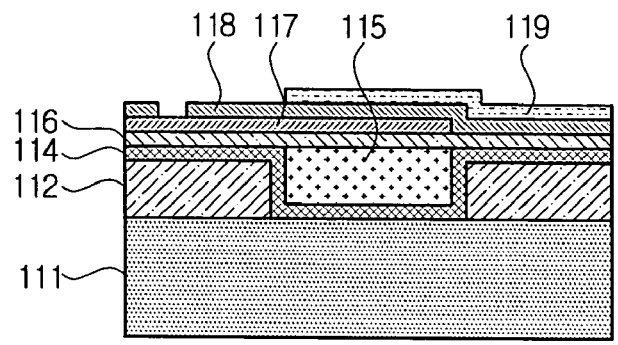
Figure 3K:
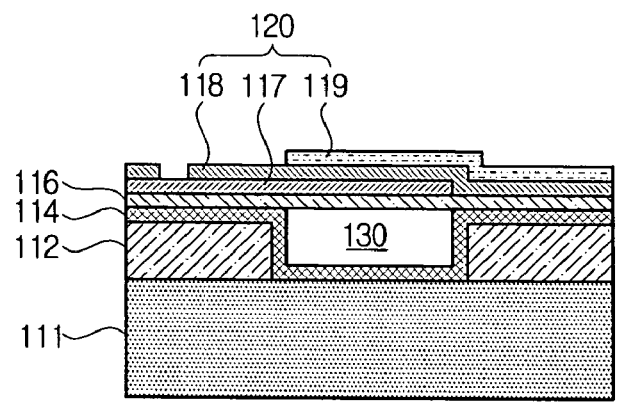

FIG. 3K is a cross-section of a structure of a FBAR according to an embodiment of the present invention. The FBAR includes a first resistance layer 112 formed on a semiconductor substrate 111 and having air gap 130, a second resistance layer 114 stacked on the air gap 130 and the first resistance layer 112, a membrane layer 116 stacked on the second resistance layer 114 over the air gap 130, and a resonator 120 having a lower electrode 117, a piezoelectric layer 118, and an upper electrode stacked in that order on the membrane layer 116.

The above FBAR can reduce the substrate loss upon resonating since the air gap 130 is formed without etching the semiconductor substrate 111. The above FBAR can also increase the degree of integration with other devices, since active or passives devices can be formed underneath the air gap 130.

FIG. 3A to FIG. 3K illustrate cross-sections at the processing steps for manufacturing a FBAR according to an embodiment of the present invention. First, the upper portion of the semiconductor substrate 111 may be optionally etched or otherwise processed to a predetermined thickness as shown in FIG. 3A. Then, the first resistance layer 112 is deposited as shown in FIG. 3B. Next, photoresist 113 is coated on the upper portion of the resistance layer, and an air gap forming position is patterned on the photoresist 113 through the exposure and development as shown in FIG. 3C. Next, the first resistance layer 112 is removed from the patterned air gap forming position to form a recess 112'. The recess 112' may extend to the upper surface of the semiconductor substrate 111. The photoresist 113 is then removed (not shown). Next, a second resistance layer 114 is formed on the first resistance layer 112 and on the recess 112' as shown in FIG. 3D, The second resistance layer 114 has a predetermined thickness in the recess in accordance with a desired resonant frequency. Next, a sacrificial material 115 fills the recess or air gap forming portion 112' as shown in FIG. 3E. If the sacrificial material 115 extends above an upper surface of the second resistance layer 114, a flattening process may be performed to make the upper surface of the second resistance layer 114 and the sacrificial material 115 even as shown in FIG. 3F.

Next, a membrane layer 116 is deposited on the second resistance layer 114 and the sacrificial material 115 that are even with each other as shown in FIG. 3G. Next, a conductive film is deposited on the membrane layer 116, inclusive of the air gap forming position 112', to form a lower electrode 117 as shown in FIG. 3H. Next, a piezoelectric material is deposited on the lower electrode 117, inclusive of the air gap forming position 112', to form a piezoelectric layer 118 as shown in FIG. 3I. Next, a conductive film is deposited on the piezoelectric layer 118, inclusive of the air gap forming position, to form an upper electrode 119 as shown in FIG. 3J. Next, the sacrificial material 115 in the air gap forming portion is removed to form the air gap 130 as shown in FIG. 3K.

As a specific example, the flattening process may include chemical mechanical polishing (CMP) process. The sacrificial material 115 may be polysilicon. Removal of the sacrificial material 115 may include dry etching using fluorochemical gas in a non-plasma state.

The processes for manufacturing a FBAR as above can maintain the pre-set resonance characteristics and eliminate possible damage due to the air gap formation, since dry etching does not affect the electrodes and the piezoelectric material, as does wet etching.

Figure 4:
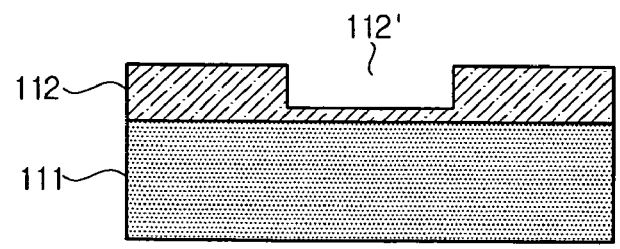
FIG. 4 illustrates a cross-section of an alternative resistance layer configuration to the second resistance layer of FIG. 3D.

The second resistance layer is not necessarily required, but could be replaced by stopping removal of the first resistance layer before reaching the upper surface of the semiconductor substrate. FIG. 4 shows the first resistance layer etched to a predetermined thickness in the recess 112' to replace the second resistance layer shown in FIGS. 3D–3K. This predetermined thickness is selected in accordance with a desired resonant frequency. The remainder of the process steps may remain the same.

While the above method includes etching the semiconductor substrate, such etching is not necessarily required. The formation of the recess and the deposition of the first resistance layer may be realized using different techniques than those set forth above, such as other lithographic techniques or other selective deposition techniques, e.g., screen printing. Further, materials other than polysilicon may be used for the sacrificial material. Additionally, the sacrificial material can be removed by dry etching using a different material than fluorochemical in the non-plasma state. Preferably, the sacrificial material may be removed using techniques that do not affect the rest of the FBAR. Further, other removal techniques, such as wet etching, may be used to eliminate the sacrificial material, again that preferably do not affect the rest of the FBAR.

As described above, the FBAR and the method for manufacturing the same according to the present invention can improve the resonance characteristics, since the air gap is formed without etching the semiconductor substrate, thereby reducing dielectric permittivity loss of the substrate. Further, the FBAR and the method for manufacturing the same according to the present invention can increase integration thereof, since the air gap allows other active and passive devices to be integrated with the FBAR.

Further, when the FBAR manufacturing processes uses a removal process, e.g., dry etching, for the sacrificial material that does not influence the electrodes and the piezoelectric material. Thus, the FBAR of the present invention can maintain the initially set resonance characteristics and improve yield.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A film bulk acoustic resonator, comprising:
   a semiconductor substrate;
   a first resistance layer formed on a surface of the semiconductor substrate, the first resistance layer having a recess;
   a membrane layer formed on the first resistance layer over the recess, thereby forming in the recess an air gap region of the acoustic resonator;
   a first electrode formed on the membrane layer;
   a piezoelectric layer formed on the membrane layer and an exposed portion of the first electrode;
   a second electrode formed on the piezoelectric layer; and
   a second resistance layer formed on the first resistance layer.

2. The film bulk acoustic resonator as claimed in claim 1, wherein the second resistance layer has a predetermined thickness in the recess.

3. A film bulk acoustic resonator, comprising:
   a semiconductor substrate;
   a first resistance layer formed on a surface of the semiconductor substrate, the first resistance layer having a recess;
   a membrane layer formed on the first resistance layer over the recess, thereby forming in the recess an air gap region of the acoustic resonator;
   a first electrode formed on the membrane layer;
   a piezoelectric layer formed on the membrane layer and an exposed portion of the first electrode; and
   a second electrode formed on the piezoelectric layer,
   wherein the first resistance layer has a predetermined thickness in the recess.

4. A method for manufacturing a film bulk acoustic resonator, the method comprising:

forming a resistance layer on an upper surface of a semiconductor substrate, the resistance layer including a recess;

filling the recess with a sacrificial material;

providing a membrane layer on an upper surface of the resistance layer and an upper surface of the sacrificial material;

forming a first electrode on an upper surface of the membrane layer;

forming a piezoelectric layer on the upper surface of the membrane layer and on an upper surface of the first electrode;

forming a second electrode on an upper surface of the piezoelectric layer; and removing the sacrificial material, thereby forming an air gap between the semiconductor substrate and the membrane layer.

5. The method as claimed in claim 4, further comprising etching the semiconductor substrate to a predetermined thickness before the forming of the resistance layer.

6. The method as claimed in claim 4, wherein the forming of the resistance layer includes exposing the semiconductor substrate through the recess.

7. The method as claimed in claim 4, wherein the forming of the resistance layer includes:

depositing a resistance material on the upper surface of the semiconductor substrate;

patterning an air gap forming position on an upper surface of the resistance layer;

removing a portion of the resistance material in the air gap patterning position from the upper surface of the resistance layer to form the recess.

8. The method as claimed in claim 7, wherein the patterning of the air gap forming position includes providing a patterning material on an upper surface of the resistance material.

9. The method as claimed in claim 8, further comprising removing the patterning material after the removing of the portion of the resistance material.

10. The method as claimed in claim 7, wherein the removing of the portion of the resistance material includes etching the resistance material.

11. The method as claimed in claim 7, wherein the removing of the portion of the resistance material includes removing all of the resistance material in the air gap portion.

12. The method as claimed in claim 7, wherein the removing of the portion of the resistance material includes leaving the resistance material at a predetermined thickness in the air gap portion.

13. The method as claimed in claim 4, further comprising forming a second resistance layer on an upper surface of the recess.

14. The method as claimed in claim 13, wherein the forming of the second resistance layer includes depositing a second resistance material on upper surfaces of the recess and the resistance layer.

15. The method as claimed in claim 4, further comprising evening out the upper surface of the resistance layer and the upper surface of the sacrificial material prior to the providing of the membrane layer.

16. The method as claimed in claim 4, wherein the sacrificial material is polysilicon.

17. The method as claimed in claim 4, wherein the removing of the sacrificial material includes dry-etching the sacrificial material.

18. The method as claimed in claim 17, wherein the dry-etching includes using fluorochemical gas in a non-plasma state.

* * * * *